US012604435B2

(12) United States Patent
Rasalingam et al.

(10) Patent No.: US 12,604,435 B2
(45) Date of Patent: Apr. 14, 2026

(54) HEAT HARVESTING IN DATA STORAGE DEVICES

(71) Applicant: Sandisk Technologies, Inc., Milpitas, CA (US)

(72) Inventors: Uthayarajan AL Rasalingam, Nibong Tebal (MY); Niladri Dey, West Bengal (IN)

(73) Assignee: Sandisk Technologies, Inc., Milpitas, CA (US)

( * ) Notice: Subject to any disclaimer, the term of this patent is extended or adjusted under 35 U.S.C. 154(b) by 501 days.

(21) Appl. No.: 18/449,483

(22) Filed: Aug. 14, 2023

(65) Prior Publication Data

US 2024/0422938 A1    Dec. 19, 2024

Related U.S. Application Data

(60) Provisional application No. 63/508,994, filed on Jun. 19, 2023.

(51) Int. Cl.
| | |
|---|---|
| *H10N 10/00* | (2023.01) |
| *F04D 25/06* | (2006.01) |
| *F04D 27/00* | (2006.01) |
| *H05K 1/02* | (2006.01) |
| *H05K 7/20* | (2006.01) |
| *H10N 10/17* | (2023.01) |

(52) U.S. Cl.
CPC ......... *H05K 7/20209* (2013.01); *F04D 25/06* (2013.01); *F04D 27/00* (2013.01); *H05K 1/0203* (2013.01); *H10N 10/17* (2023.02); *H05K 2201/10159* (2013.01)

(58) Field of Classification Search
CPC .. G03B 21/16; F25B 21/02; F25B 2321/0212; F25B 27/02; H10N 10/00; H10N 10/10; H10N 10/85; H10N 15/00; H10N 19/00; H10N 10/17; H02N 11/002; G06F 1/20; H05K 2201/10159; H05K 1/0203; H05K 7/20209
USPC ....................................................... 361/679.48
See application file for complete search history.

(56) References Cited

U.S. PATENT DOCUMENTS

| | | | | |
|---|---|---|---|---|
| 5,419,780 | A * | 5/1995 | Suski | H01L 23/38 |
| | | | | 136/224 |
| 5,921,087 | A * | 7/1999 | Bhatia | F25B 21/02 |
| | | | | 136/203 |
| 6,798,659 | B2 * | 9/2004 | Chen | H01L 23/467 |
| | | | | 361/704 |
| 7,436,059 | B1 * | 10/2008 | Ouyang | H01L 23/38 |
| | | | | 257/713 |
| 2021/0391524 | A1 * | 12/2021 | Kishizawa | H10N 10/10 |
| 2025/0063949 | A1 * | 2/2025 | Li | H10N 10/13 |
| 2025/0218895 | A1 * | 7/2025 | Wang | H01L 25/18 |

\* cited by examiner

*Primary Examiner* — Mandeep S Buttar
(74) *Attorney, Agent, or Firm* — Michael Best & Friedrich LLP

(57)    ABSTRACT

A data storage device includes TE elements thermally connected between IC chips thereof and a lid assembly. An electronic controller of the data storage device is configured to receive voltages generated by the TE elements in response to the heat generated in the IC chips and is further configured to use the voltages to provide electrical power to an electrical fan of the lid assembly. The fan generates an airflow for keeping the lid assembly at approximately ambient temperature, thereby facilitating heat removal from the IC chips by way of the TE elements.

20 Claims, 11 Drawing Sheets

HEAT HARVESTING IN DATA STORAGE DEVICES

CROSS-REFERENCE TO RELATED APPLICATION

This application claims priority to and the benefit of U.S. Provisional Patent Application No. 63/508,994, filed on Jun. 19, 2023, the entire contents of which is incorporated herein by reference.

FIELD

This application relates generally but not exclusively to heat management in data storage devices.

BACKGROUND

Overheating worsens the performance of solid-state drives (SSDs) and may compromise data retention and endurance. Some SSDs retain data by trapping electrons in the transistor gate. By detecting the trapped charge, the SSD distinguishes between the "zero" and "one" states that make up digital data. Excessive heat causes an increase in the energy of the electrons in the floating gates, making it easier for the charge to leak out, which translates into a higher number of bit errors. Too many bit errors may disadvantageously cause some of the stored data to have errors that are uncorrectable with the employed error-correction codes.

SUMMARY

One embodiment provides a data storage device (e.g., an SSD) having a plurality of thermoelectric (TE) elements thermally connected between integrated-circuit (IC) chips thereof and a lid assembly of the device case. An electronic controller of the data storage device is configured to receive a plurality of voltages generated by the plurality of TE elements in response to the heat generated in the IC chips and is further configured to use the plurality of voltages to provide electrical power to an electrical fan of the lid assembly. The electrical fan generates an airflow for keeping the lid assembly at approximately ambient temperature, thereby facilitating heat removal from the IC chips via the TE elements.

According to an example embodiment, provided is an device comprising: a first plate having a first main surface and an opposite second main surface; a second plate disposed at a nonzero offset distance from the first plate along the first main surface; an electrical fan having a set of blades arranged within a gap between the first plate and the second plate, the electrical fan being operable to rotate the set of blades about a rotation axis that is approximately orthogonal to the first main surface; a plurality of TE elements disposed along the opposite second main surface in thermal contact with the first plate; and a heat-management (HM) controller connected to receive a plurality of voltages generated by the plurality of TE elements in response to respective temperature differences across individual ones of the TE elements, the HM controller being configured to use the plurality of voltages to provide electrical power to the electrical fan.

In some embodiments of the above device, the device further comprises a printed-circuit-board (PCB) assembly including a printed circuit board and a plurality of IC chips attached and electrically connected to the printed circuit board, wherein the individual ones of the TE elements are attached to corresponding ones of the IC chips; and wherein the respective temperature differences across the individual ones of the TE elements are caused by heat generated in the corresponding ones of the IC chips.

According to another example embodiment, provided is a heat-management method comprising: sensing one or more temperatures in one or more locations within a device assembly; and electrically connecting a plurality of TE elements to provide electrical power to an electrical fan when a temperature metric is greater than a first threshold value, the temperature metric being based on the one or more temperatures. The device assembly comprises: a PCB assembly including a printed circuit board and a plurality of IC chips attached and electrically connected to the printed circuit board; the plurality of TE elements having individual ones of the TE elements thermally connected between corresponding ones of the IC chips and an adjacent part of a device case of the device assembly; and an HM controller connected to receive a plurality of voltages generated by the plurality of TE elements in response to heat generated in the corresponding ones of the IC chips, the HM controller being configured to use the plurality of voltages to provide the electrical power to the electrical fan. The electrical fan is configured to generate an airflow for keeping the adjacent part of the device case at approximately ambient temperature.

According to yet another example embodiment, provided is a solid-state drive comprising: a device case including a bottom casing and a lid assembly attached to each other, the lid assembly including an electrical fan; a printed-circuit-board assembly disposed in the device case and including a printed circuit board and a plurality of IC chips attached and electrically connected to the printed circuit board, the plurality of IC chips including a plurality of storage dies and an electronic controller of the solid-state drive; and a plurality of TE elements having individual ones of the TE elements thermally connected between corresponding ones of the IC chips and the lid assembly, wherein the electronic controller is configured to receive a plurality of voltages generated by the plurality of TE elements in response to heat generated in the corresponding ones of the IC chips and further configured to use the plurality of voltages to provide electrical power to the electrical fan; and wherein the electrical fan is configured to generate an airflow for keeping the lid assembly at approximately ambient temperature.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the controller can be performed by hardware (for example, analog or digital circuits), a combination of hardware and software (for example, program code or firmware stored in a non-transitory computer-readable medium that is executed by a processor or control circuitry), or any other suitable means. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein may be applicable to other types of solid-state memory, such as NOR, PCM ("Phase Change Memory"), ReRAM, etc.

Figure 1:
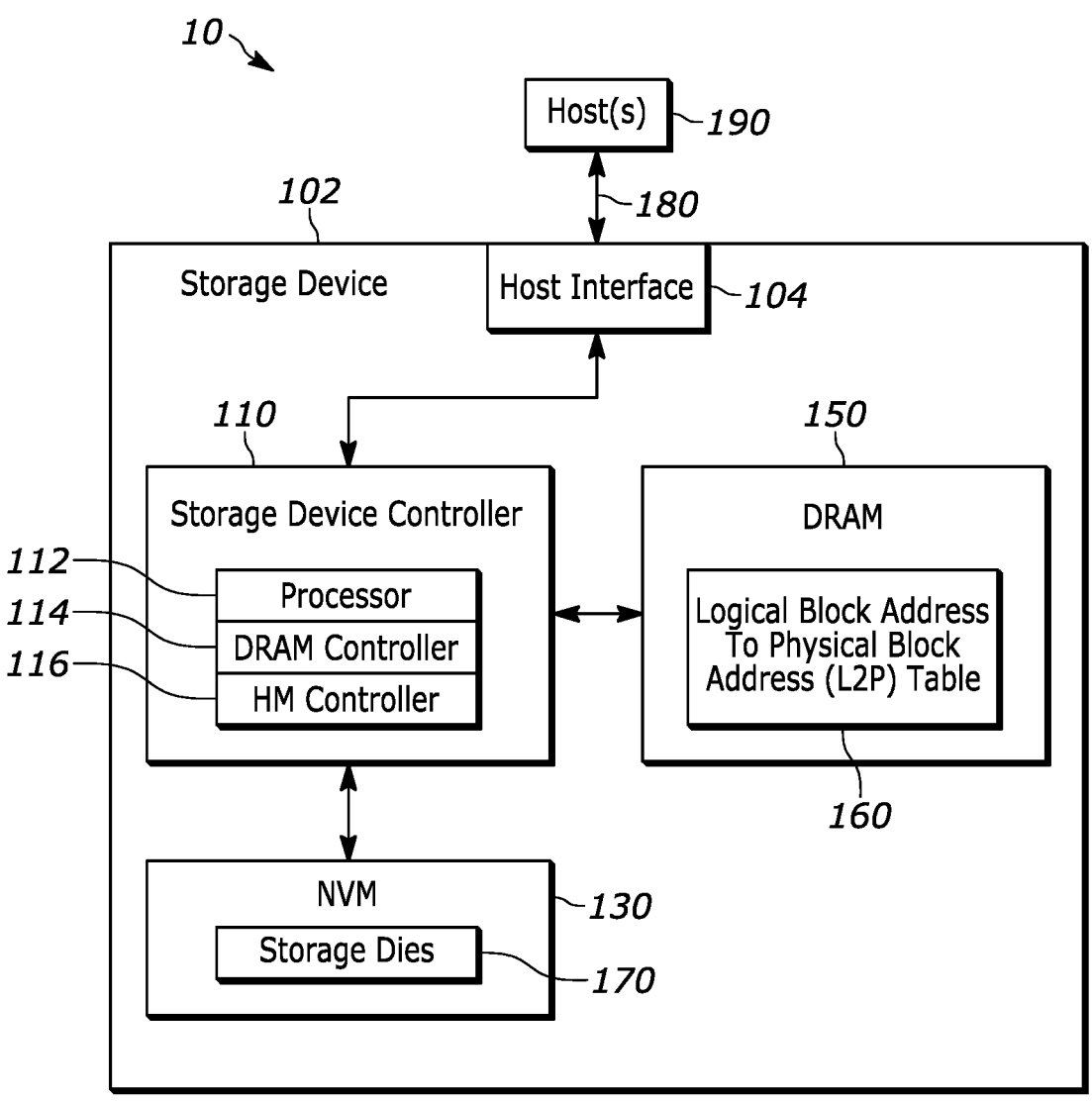
FIG. 1 is a block diagram illustrating a data-storage system in which various embodiments may be practiced.

FIG. 1 is a block diagram illustrating a data-storage system 10 in which example embodiments can be practiced. The system 10 comprises a data storage device 102 connected to a host device 190 by way of a communication path 180. In an example embodiment, the communication path 180 can be implemented using an electrical bus, a wireless connection, or any other suitable data link. The data storage device 102 can be a flash memory device, e.g., an SSD, a flash memory, or other suitable nonvolatile memory (NVM).

In some embodiments, the data storage device 102 may be embedded within the host device 190. In some other embodiments, the data storage device 102 may be removable from the host device 190, e.g., may be removably coupled to the host device 190 in accordance with a removable universal serial bus (USB) configuration. In some embodiments, the data storage device 102 may be used as an embedded storage drive, e.g., a mobile embedded storage drive, an enterprise storage drive (ESD), a client storage device, a cloud storage drive, or other suitable data storage device.

As shown in FIG. 1, the data storage device 102 comprises a host-device interface 104, an electronic controller 110, an NVM 130, and a volatile memory (e.g., a DRAM) 150. In operation, the host-device interface 104 enables communications between the data storage device 102 and the host device(s) 190. Such communications may include, inter alia, transmission of data between the NVM 130 and the host device(s) 190. The NVM 130 comprises storage dies 170, which may include any one type or any suitable combination of NAND flash devices, NOR flash devices, and/or other suitable nonvolatile memory devices. The storage dies 170 may be organized into channels, each of the channels being based on a corresponding bus, e.g., an 8-bit bus, connecting the corresponding subset of the storage dies 170 to the controller 110. Individual ones of the storage dies 170 may further be organized into a hierarchy of planes, blocks, and pages. The NVM 130 and/or individual ones of the storage dies 170 thereof may also include support circuitry (not explicitly shown in FIG. 1), such as read and write circuitry. Such read/write circuitry may be implemented in a single component or may be divided into separate components, such as a read-circuitry component and a separate write-circuitry component. In an example embodiment, the DRAM 150 is used, inter alia, to store an L2P table 160. In operation, the data storage device 102 uses the L2P table 160 to translate logical addresses of input/output (I/O) requests to corresponding flash-memory addresses. The layer that performs the translation is referred to as the flash translation layer (FTL).

The controller 110 includes components, such as circuits, firmware, and software, that bridge the NVM 130 to the host-device interface 104, with only some of such components being explicitly shown in FIG. 1 for better clarity. For example, controller 110 may include: (i) an embedded processor 112; (ii) an electrically erasable firmware read-only memory (ROM, not explicitly shown in FIG. 1); (iii) a DRAM controller 114; (iv) an error-correction code (ECC) circuit or module (not explicitly shown in FIG. 1); (v) a heat-management (HM) controller 116; and (vi) a flash component interface (not explicitly shown in FIG. 1). In some embodiments, controller 110 may also incorporate the DRAM 150 or other functionally similar volatile-memory having stored therein the L2P table 160.

The processor 112 is configured to support, e.g., some or all of the following operations: wear leveling, bad-block management, data scrambling, error-correction coding, garbage collection, trim, address mapping, and other pertinent operations. The DRAM controller 114 operates as an electronic controller of the DRAM 150. The HM controller 116 performs operations directed at heat harvesting, e.g., for purposes of charging a supplemental power supply and/or powering up one or more electrical fans configured to generate a cooling air flow in the data storage device 102. In some embodiments, the HM controller 116 can be implemented as a separate physical unit located outside the controller 110 (e.g., see FIG. 7). In such embodiments, appropriate communication is established between the HM controller 116 and the electronic controller 110 to appropriately coordinate various HM operations described in more detail below.

Figure 2:
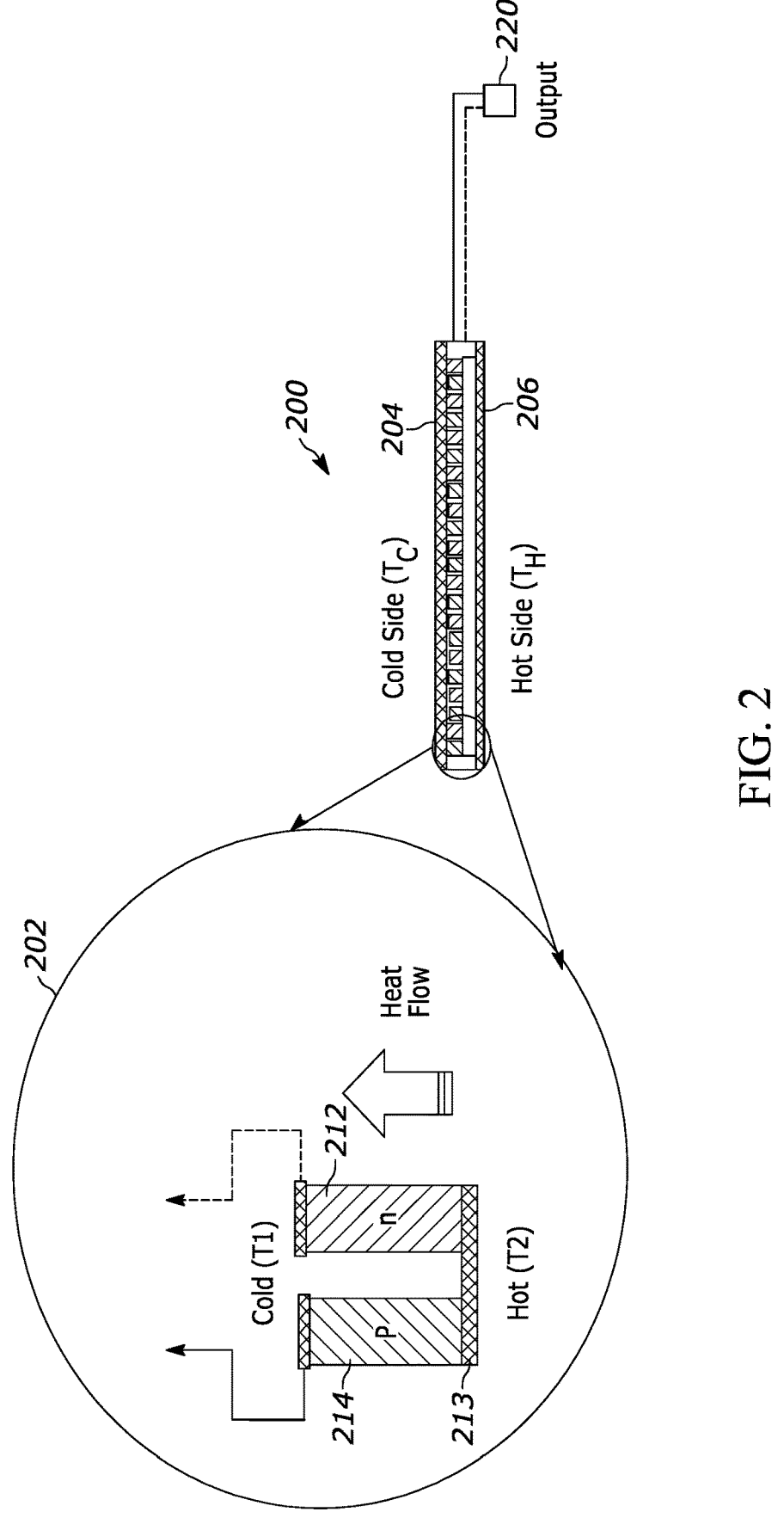
FIG. 2 is schematic diagram illustrating a TE element that can be used in the data storage system of FIG. 1 according to some embodiments.

FIG. 2 is schematic diagram illustrating a TE element 200 that can be used in the data storage device 102 according to some embodiments. The TE element 200 includes a plurality of Peltier modules 202, one of which is shown in more detail in the expansion panel. The plurality of Peltier modules 202 is sandwiched between two substrates 204, 206 such that different ones of the Peltier modules 202 are thermally in parallel with one another. In some examples, the substrates 204, 206 are made of a ceramic material. In other examples, other suitable materials may also be used. Electrical connections inside the TE element 200 are such that the Peltier modules 202 are electrically in series with each other.

An individual Peltier module 202 includes an n-doped semiconductor pellet 212 and a p-doped semiconductor pellet 214 electrically connected by an electrically conducting tab 213 as indicated in FIG. 2. Additional electrically conducting tabs 213 are similarly used to provide serial electrical connections between different ones of the individual Peltier modules 202 of the TE element 200. In one example, the doped semiconductor pellets 212, 214 include appropriately doped bismuth telluride ($Bi_2Te_3$). In other examples, other suitable semiconductor materials, such as lead telluride, silicon-germanium, and bismuth antimonide alloys, can also be used.

When a temperature difference $\Delta T (=T_H-T_C)$ exists between the ceramic substrates 204 and 206, a voltage and/or current proportional to the number of Peltier modules 202 in the TE element 200 is generated at an output terminal 220. For an open circuit, the output voltage $V_{out}$ at the output terminal 220 is given by Eq. (1):

$$V_{out} = S \times \Delta T \qquad (1)$$

where S is the Seebeck coefficient. When a resistive load $R_L$ is connected at the output terminal 220, the output current $I_{out}$ at the output terminal 220 is given by Eq. (2):

$$I_{out} = V_{out}/(R_L + R_{TE}) \qquad (2)$$

where $R_{TE}$ is the electrical resistance of the TE element 200.

Figures 3A, 3B:
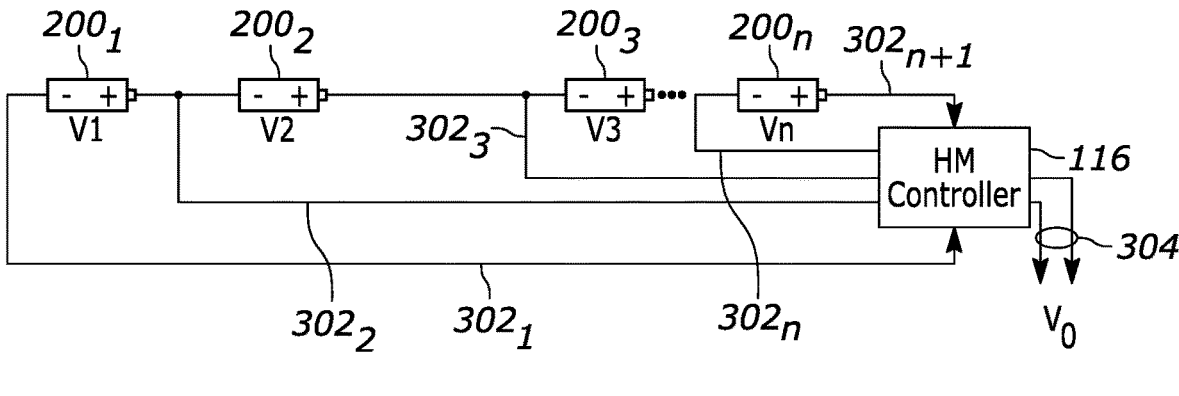
FIGS. 3A and 3B show circuit diagrams for electrically connecting several TE elements of FIG. 2 in the data storage system of FIG. 1 according to some embodiments.

FIGS. 3A and 3B show circuit diagrams for electrically connecting several of the TE elements 200 in the data storage device 102 according to some embodiments. In the embodiment of FIG. 3A, TE elements $200_1$-$200_n$ are connected serially such that a combined output voltage $V_0$ at an output port 304 of the HM controller 116 can be as high as the sum of individual output voltages $V_1$, $V_2$, ..., $V_n$ of the TE elements $200_1$-$200_n$. Since the individual output voltages $V_1$, $V_2$, ..., $V_n$ depend on the corresponding local temperature differences $\Delta T$ (see Eq. (1)), which can vary significantly across the data storage device 102, the HM controller 116 is equipped with an internal reconfigurable switch (not explicitly shown) connected between electrical lines $302_1$-$302_{n+1}$ and the output port 304. In operation, the HM controller 116 senses the individual output voltages $V_1$, $V_2$, ..., $V_n$ and then configures the internal reconfigurable switch based on the sensed voltages. In one example, the HM controller 116 operates to reconfigure the internal reconfigurable switch to exclude from the electrical series those of the TE elements $200_1$-$200_n$ whose individual output voltages are smaller than a selected fixed threshold voltage. In another example, the HM controller 116 operates to reconfigure the internal reconfigurable switch such that the power output at the output port 304 (for a given load) is approximately maximized.

In the embodiment of FIG. 3B, TE elements $200_1$-$200_n$ are connected between electrical lines 312 and 314 in parallel with one another. Again, due to possible variations among the individual output voltages $V_1$, $V_2$, ..., $V_n$, the HM controller 116 is configured to sense the input voltage $V_{in}$ received on the electrical lines 312, 314 and take appropriate control actions to stabilize the corresponding output voltage $V_0$ at the output port 304. In some examples, the HM controller 116 employs a resistor network having a set of switches that are reconfigured based on the sensed input voltage $V_{in}$ such that the output voltage $V_0$ remains substantially constant. In some embodiments, the HM controller 116 has the capability and electrical connections to selectively change the connection configuration of the TE elements $200_1$-$200_n$ between the serial configuration illustrated in FIG. 3A and the parallel configuration illustrated in FIG. 3B.

Figure 4:
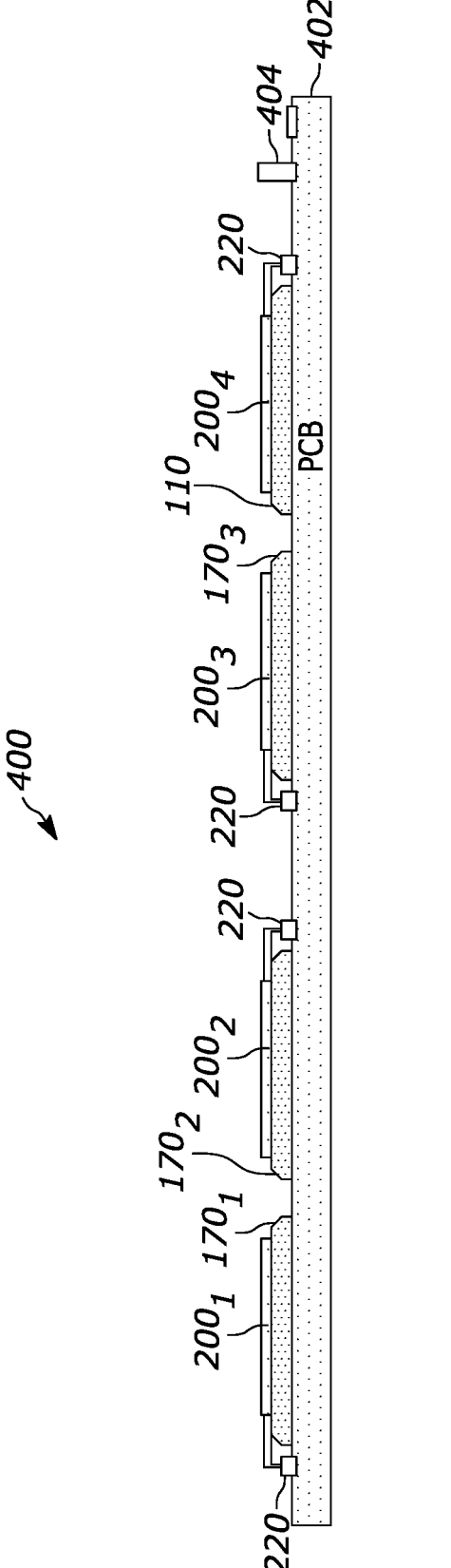
FIG. 4 is a schematic diagram of a printed-circuit-board (PCB) assembly that can be used to implement a data storage device used in the data storage system of FIG. 1 according to some embodiments.

FIG. 4 is a schematic diagram illustrating a PCB assembly 400 that can be used to implement the data storage device 102 according to some embodiments. The PCB assembly 400 is illustratively shown as including three storage IC chips, which are labeled $170_1$, $170_2$, and $170_3$, respectively, and an application specific integrated circuit (ASIC) chip that implements the controller 110. In other embodiments, the PCB assembly 400 may include a different (from three) number of storage IC chips 170 and/or one or more additional ASIC chips configured to support various functions of the data storage device 102. In the example shown, the ASIC chip 110 includes circuitry implementing the HM controller 116. The storage IC chips $170_1$-$170_3$ and the ASIC chip 110 are mounted on and electrically connected to a printed circuit board 402 of the PCB assembly 400.

The PCB assembly 400 further includes TE elements $200_1$-$200_4$. The TE elements $200_1$-$200_3$ are attached to top surfaces of the storage IC chips $170_1$-$170_3$, respectively. The TE element $200_4$ is attached to a top surface of the ASIC chip 110. The output terminals 220 of the TE elements $200_1$-$200_4$ are electrically connected to the PCB 402. The PCB 402 has electrical lines that connect the output terminals 220 of the TE elements $200_1$-$200_4$ to the HM controller 116 located in the ASIC chip 110 in accordance with the circuit diagram(s) shown in FIG. 3A and/or FIG. 3B. The PCB 402 also has electrical lines that connect the output port 304 of the HM controller 116 to an electrical connector 404 attached to the top surface of the PCB.

Figure 5A:
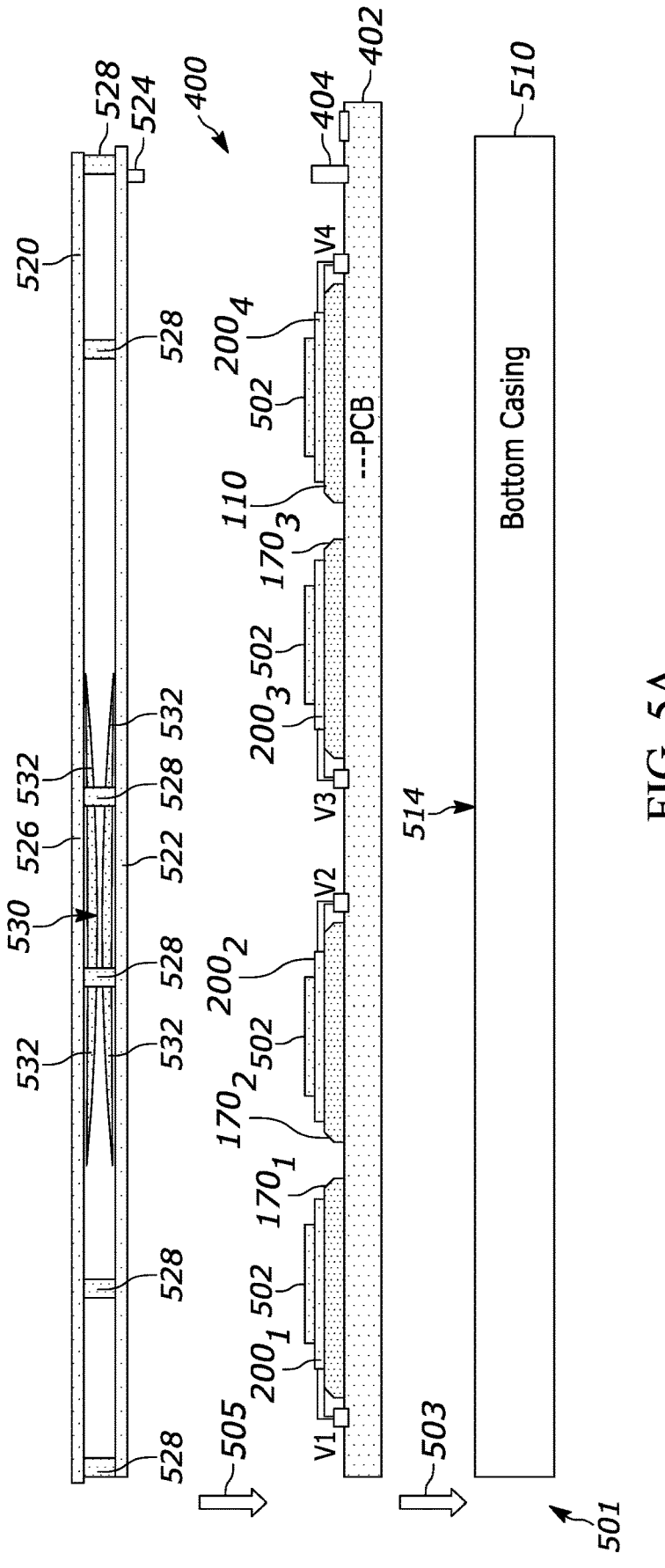
FIGS. 5A and 5B are schematic diagrams pictorially illustrating a method of putting together a device assembly including the PCB assembly of FIG. 4 according to some embodiments.
Figure 5B:
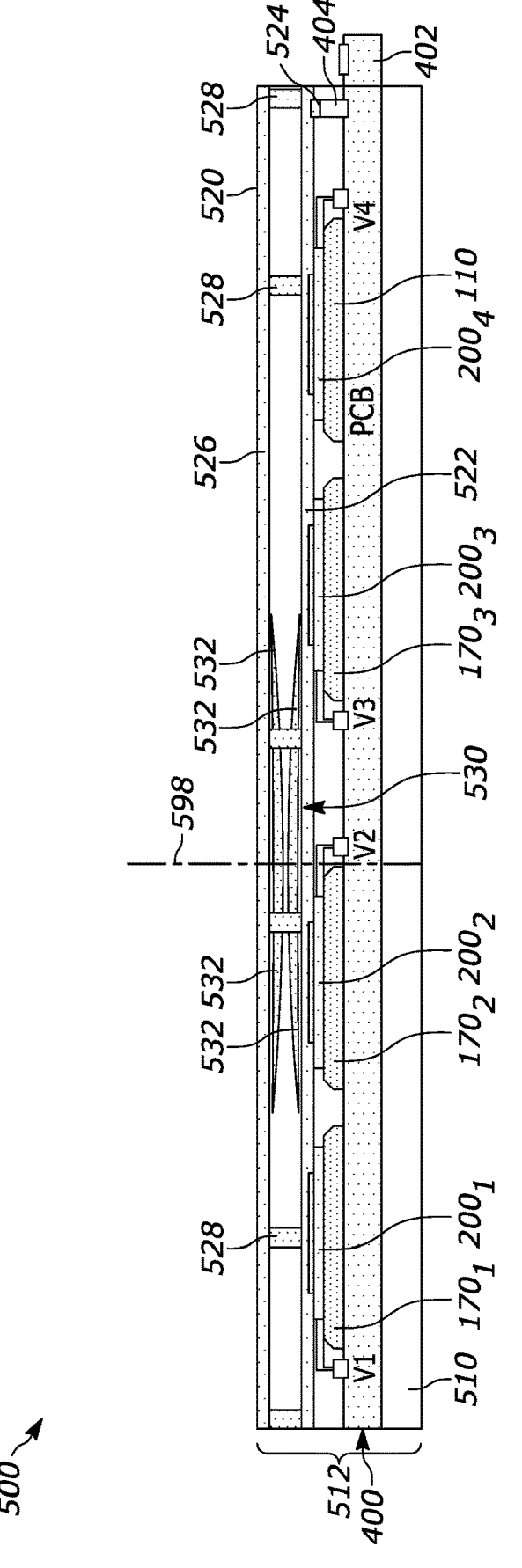

FIGS. 5A and 5B are schematic diagrams illustrating a device assembly 500 including the PCB assembly 400 according to some embodiments. More specifically, FIG. 5A illustrates a method 501 of putting together the device assembly 500. FIG. 5B illustrates an assembled form of the device assembly 500.

In the example shown, the method 501 includes placing pellets 502 of a thermal interface material (TIM) onto the top surfaces of the TE elements $200_1$-$200_4$ in the PCB assembly 400. Herein, the term "TIM" generally refers to a material that, if inserted between two components, enhances the thermal coupling between them. For example, a TIM may be used for heat dissipation, e.g., when inserted between a heat-producing circuit component and a heat sink. The semiconductor industry and its suppliers develop, use, and sell a large variety of TIMs suitable for different specific applications, such as for minimizing the thermal-boundary resistance between layers, enhancing thermal-management performance, lowering thermal stress between materials, providing a relatively low elastic modulus, achieving good flexibility, etc. For example, the following TIM types may currently be available in the market: (i) thermal paste; (ii) thermal adhesive; (iii) thermal gap filler; (iv) thermally conductive pads; (v) thermal tape; (vi) phase-change materials; and (vii) solid (e.g., metal) TIMs. Some TIMs may be supplied in a fluid (e.g., gel-like) form for convenient application and are typically cured into a solid form after being placed into the product. Depending on the specific characteristics and chemical composition of such TIMs, the curing process may involve an elevated temperature, exposure to light, or application of a chemical stimulus.

The method 501 also includes inserting the PCB assembly 400 into a bottom casing 510 of a device case 512 as indicated by a block arrow 503 in FIG. 5A and then appropriately securing the PCB assembly 400 therein, e.g., using screws or other suitable fasteners. In one example, the bottom casing 510 has a pan-like shape and is made of stamped sheet metal or die-cast metal. The depth of the bottom casing 510 is such that the TIM pellets 502 are approximately level with top edges 514 of the side walls of the bottom casing 510.

The method 501 further includes placing a lid assembly 520 on top of the bottom casing 510 as indicated by a block arrow 505 in FIG. 5A. The lid assembly 520 includes a first plate 522 and a second plate 526 connected to one another using a plurality of spacer columns 528. In some examples, the spacer columns 528 are made of a suitable plastic or ceramic material. In some examples, the spacer columns 528 are made of aluminum or other metal. The lid assembly 520 also has an electrical fan 530 in the gap between the first plate 522 and the second plate 526. When turned ON, an electrical motor of the electrical fan 530 rotates a set of blades 532 about a rotation axis 598 to create an air stream flowing between the first plate 522 and the second plate 526 approximately parallel to the main surfaces thereof. The rotation axis 598 is approximately (e.g., to within ±5 degrees) orthogonal to the plates 522, 526.

Herein, a "main plane" of an object, such as a die, a substrate, an IC, a plate, or a PCB is a plane parallel to a substantially planar surface thereof that has about the largest area among exterior surfaces of the object. This substantially planar surface may be referred to as a main surface. The exterior surfaces of the object that have one relatively large size, e.g., length, but are of much smaller area, e.g., less than one quarter of the main-surface area, are typically referred to as the edges of the object. Herein, the term "vertical" refers to a direction that is approximately orthogonal to a main plane of the PCB 402. The term "horizontal" refers to a direction that is approximately parallel to the main plane of the PCB 402.

The bottom surface of the first plate 522 has an electrical connector 524 that is lined up and compatible with the electrical connector 404 of the PCB 402. In the assembled form of the device case 512 shown in FIG. 5B, the electrical connectors 404 and 524 engage each other. The lid assembly 520 has electrical lines that electrically connect electrical connector 524 to the electrical fan 530. As such, in the assembled form of the device case 512 shown in FIG. 5B, electrical power can controllably be applied from the output port 304 of the HM controller 116 (see FIGS. 3A, 3B) located at the ASIC chip 110 to the electrical fan 530.

Figure 6:
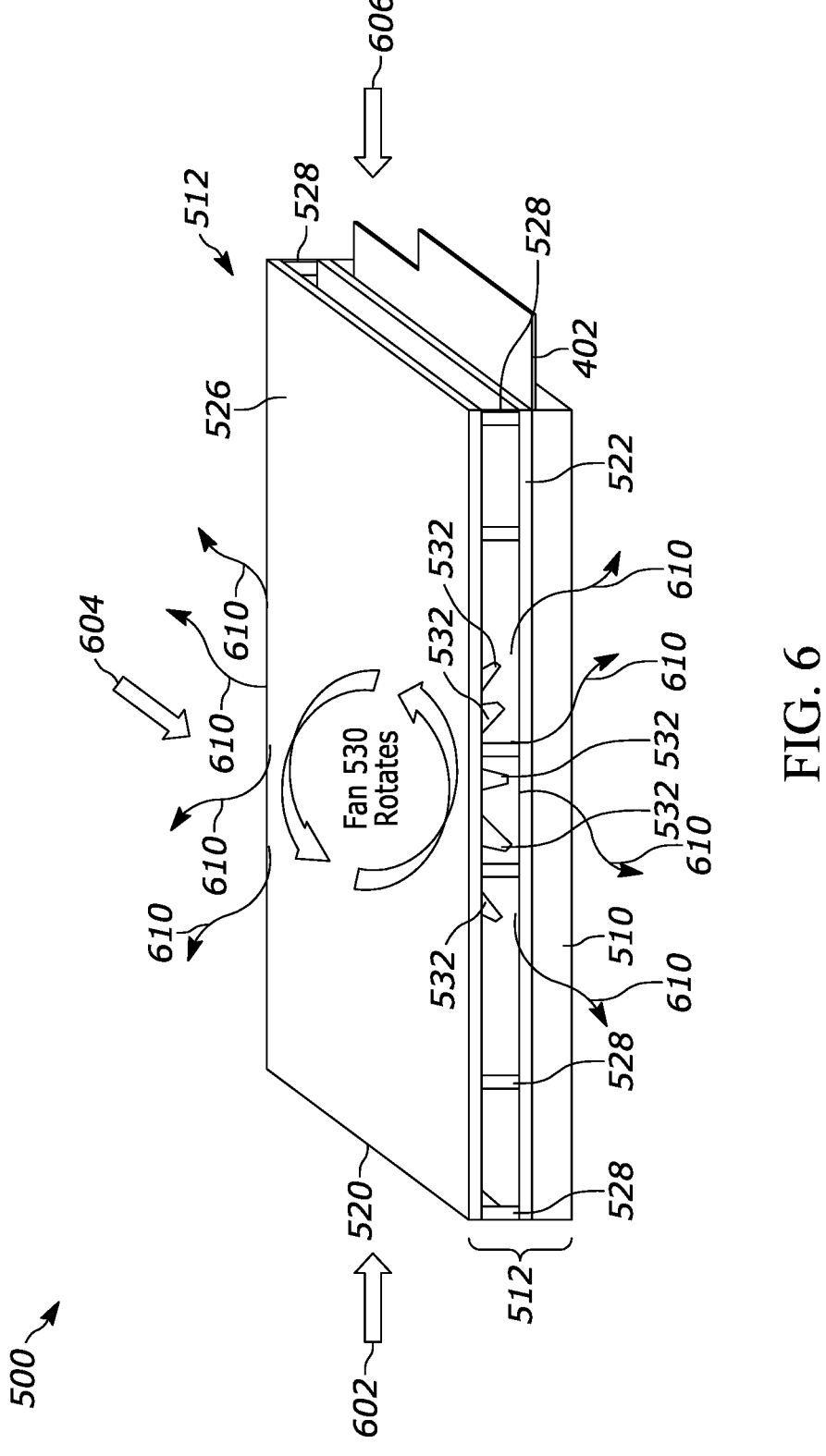
FIG. 6 is a schematic diagram illustrating a three-dimensional perspective view of the device assembly made using the method illustrated in FIGS. 5A and 5B according to some embodiments.

FIG. 6 is a schematic diagram illustrating a three-dimensional perspective view of the device assembly 500 according to some embodiments. In operation, the lid assembly 520 is cooled down using air flows having at least two components. A first air-flow component is a system air flow 602, 604, and/or 606 created by a system cooling fan, e.g., configured to ventilate the equipment cabinet, rack, box, or shelf (not explicitly shown), wherein the device assembly 500 is located. Due to the open layout of the lid assembly 520 provided with the spacer columns 528, the gap between the first plate 522 and the second plate 526 of the lid assembly 520 can accept the system air flow from substantially any horizontal direction as indicated by the variously oriented block arrows 602, 604, and 606. A second air-flow component 610 is created by the rotating blades 532 of the electrical fan 530. The air-flow component 610 expels, in multiple directions, the air supplied by the system air flow component 602, 604, or 606. Together, the air-flow components 602-606 and 610 create vigorous air circulation through the gap between the first plate 522 and the second plate 526 of the lid assembly 520, which removes heat from the lid assembly 520. In some examples, the temperature of the lid assembly 520 is targeted to be relatively close to the ambient temperature, e.g., approximately 25 degrees Celsius.

On the other hand, the storage IC chips $170_1$-$170_3$ and the ASIC chip 110 may heat up to approximately between 50 degrees Celsius and 80 degrees Celsius during operation of the data storage device 102. Temperature differences between the lid assembly 520 and the individual IC chips $170_1$-$170_3$ and 110 create corresponding respective temperature differences across the TE elements $200_1$-$200_4$, thereby causing the voltages $V_1$-$V_4$ to be generated by the TE elements and received by the HM controller 116 (also see FIGS. 2, 3A, 3B, and 5B). In response to the received voltages $V_1$-$V_4$, the HM controller 116 generates the output voltage $V_0$, e.g., as described above in reference to FIGS. 3A and 3B, and controllably uses this voltage to power the electrical fan 530.

Figure 7:
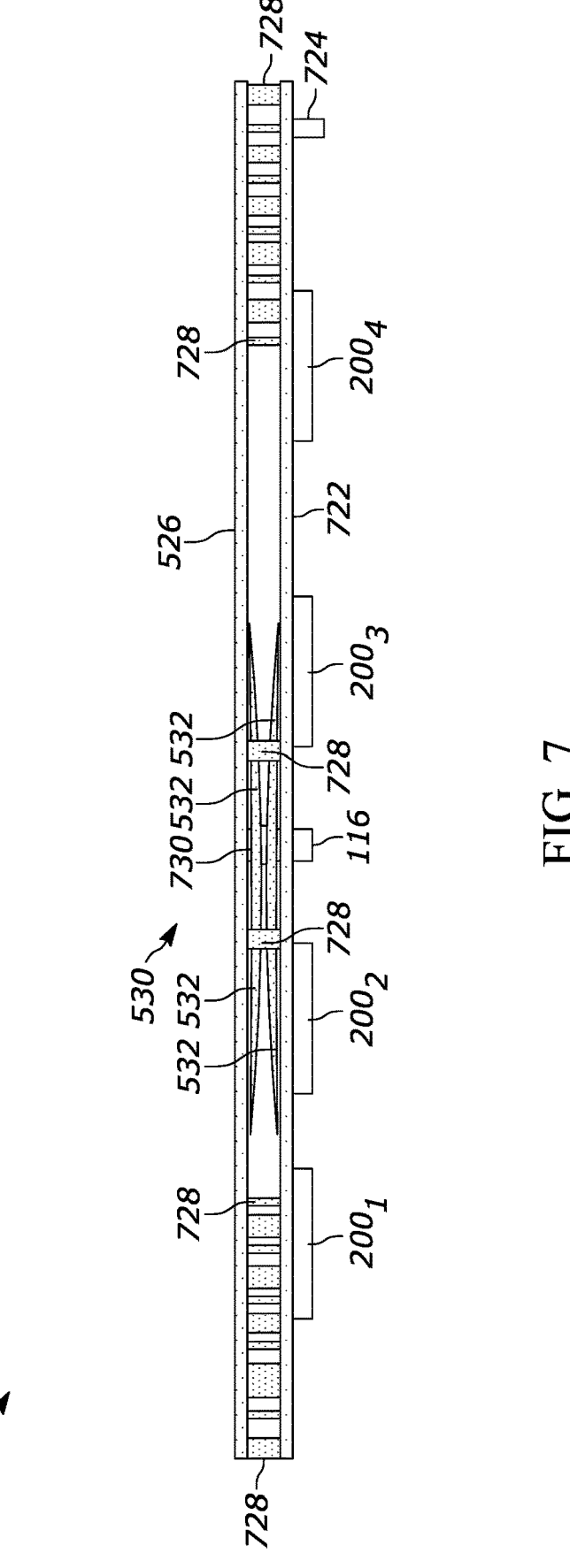
FIG. 7 is a schematic diagram illustrating a lid assembly 700 that can be used in the device assembly of FIG. 6 according to additional embodiments.
Figure 8:
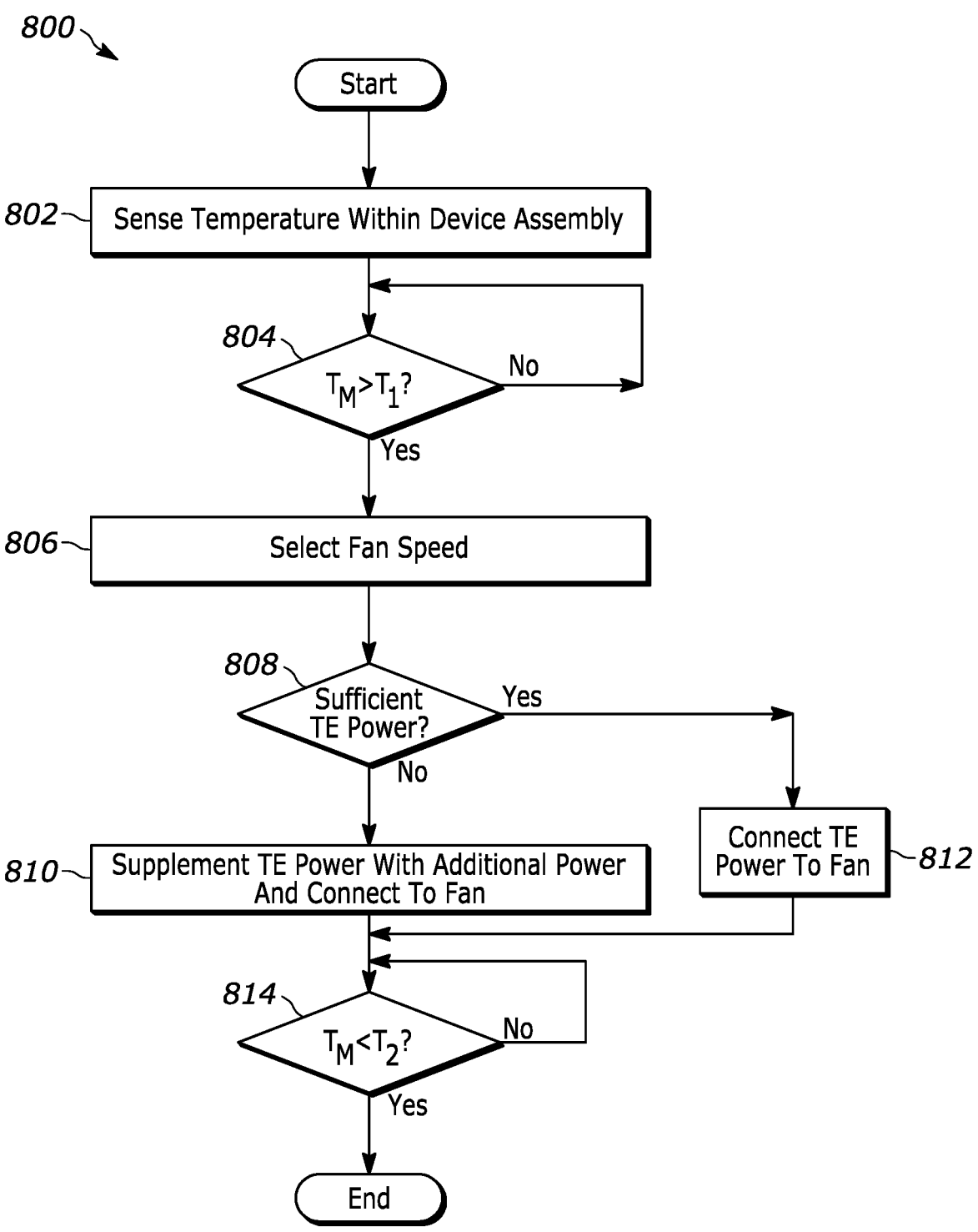
FIG. 8 is a flowchart illustrating a heat-management method that can be implemented in the device assembly of FIG. 6 according to some embodiments.

FIG. 7 is a schematic diagram illustrating a lid assembly 700 that can be used with the device case 512 according to additional embodiments. The lid assembly 700 includes some of the same components as the lid assembly 520. Those components are indicated in FIG. 7 using the same reference numerals as in FIGS. 5A, 5B, and 6. The description of the lid assembly 700 provided below mainly focuses on differences between the lid assemblies 700 and 520.

In the lid assembly 700, the first plate 522 is substituted by a different first plate 722. The first plate 722 has the TE elements $200_1$-$200_4$ directly attached thereto as indicated in FIG. 7. The first plate 722 also has the HM controller 116 (implemented as a standalone IC chip) attached thereto. The first plate 722 has sets of electrical lines to provide appropriate electrical connections for the TE elements $200_1$-$200_4$ and for the IC chip (HM controller) 116. For example, a first set of such electrical lines connects the HM controller 116 and the TE elements $200_1$-$200_4$ in accordance with the circuit diagram(s) shown in FIG. 3A and/or FIG. 3B. A second set of such electrical lines connects the HM controller 116 to an electrical connector 724. When engaged with a matching electrical connector mounted on the PCB 402, the connector 724 enables wireline communications between the HM controller 116 and the corresponding electronic controller 110 located on the PCB 402. The first plate 722 also has electrical lines that connect the output port 304 of the HM controller 116 to an electrical motor 730 of the fan 530.

The lid assembly 700 is intended for embodiments of the device assembly 500 in which the PCB assembly 400 does not have its own TE elements $200_1$-$200_4$ (also see FIG. 4). Rather, the lid assembly 700 is used to provide the TE elements $200_1$-$200_4$ to such a PCB assembly 400. To thermally connect the TE elements $200_1$-$200_4$ of the lid assembly 700 to the corresponding individual IC chips $170_1$-$170_3$ and 110 mounted on the PCB 402, a set of TIM pellets is placed directly onto the top surfaces of the individual IC chips $170_1$-$170_3$ and 110. Then, the lid assembly 700 is installed in the corresponding device assembly 500 using a method similar to the method 501 illustrated in FIG. 5A.

Another difference between the lid assemblies 700 and 520 is that the lid assembly 700 has a plurality of spacer columns 728 made of copper or other suitable material characterized by relatively high thermal conductivity. In some examples, the number of spacer columns 728 in the lid assembly 700 may be larger than the number of spacer columns 528 in the lid assembly 520. The relatively large number of the spacer columns 728 and the relatively high thermal conductivity thereof beneficially improve heat dissipation from the first plate 722, which helps to bring the temperature of that plate into a range that is relatively close to (e.g., within 5-7 degrees of) the ambient temperature even when significant amounts of heat are being generated by the IC chips $170_1$-$170_3$ and $110$ during operation of the data storage device $102$.

FIG. $8$ is a flowchart illustrating a heat-management method $800$ that can be implemented in the device assembly $500$ according to some embodiments. The method $800$ includes operations that start with the electrical fan $530$ being in the OFF state, then cause the electrical fan $530$ to be turned ON, and end with the electrical fan $530$ being turned OFF again. In various examples, the method $800$ may be repeated as needed to maintain the temperatures within the data storage device $102$ within acceptable ranges.

The method $800$ includes sensing the temperature(s) in one or more locations within the device assembly $500$ (in a block $802$). Example locations at which the temperatures may be sensed in the block $802$ by the corresponding temperature sensors (e.g., thermocouples) include the ASIC chip $110$, the individual storage IC chips $170_n$, and the first plate $522$ or $722$. Operations of the block $802$ also include the temperature sensors communicating the sensed temperature values to the HM controller $116$.

The method $800$ also includes the HM controller $116$ determining whether a temperature metric $T_M$ exceeds a first threshold value $T_1$ (in a decision block $804$). The temperature metric $T_M$ is computed by the HM controller $116$ based on the temperature values communicated by the temperature sensors. In various examples, the temperature metric $T_M$ can be computed using a predefined function of the sensed temperatures, such as a maximum, an average, a mean, a weighted sum, and so on. When the temperature metric $T_M$ is smaller than the threshold value $T_1$ ("No" at the decision block $804$), a next batch of temperature values communicated by the temperature sensors is processed by the HM controller $116$ in a next instance of the decision block $804$. When the temperature metric $T_M$ is greater than the threshold value $T_1$ ("Yes" at the decision block $804$), the method $800$ moves on to operations of a block $806$.

The operations of the block $806$ include the HM controller $116$ selecting a speed for the electrical fan $530$. In one embodiment, the HM controller $116$ operates to select the speed for the electrical fan $530$ based on the difference between the temperature metric $T_M$ and the threshold value $T_1$. For example, a greater fan speed may be selected for a larger difference. In embodiments in which the electrical fan $530$ has a single speed, operations of the block $806$ may be skipped.

The method $800$ also includes the HM controller $116$ determining (in a decision block $808$) whether the TE elements $200_1$-$200_n$ are currently capable of providing sufficient power for running the electrical fan $530$ at the speed selected in the block $806$. In some examples, to make such a determination, the HM controller $116$ may evaluate the power-generating performance of various electrical connection configurations for the TE elements $200_1$-$200_n$ described above in reference to FIGS. 3A and 3B and select a configuration that provides an approximately maximum TE power output for the present heat-distribution pattern within the device assembly $500$. The HM controller $116$ may then compare the estimated power output of the selected TE connection configuration with the power budget needed to run the electrical fan $530$ at the selected speed.

When the estimated TE power output is lower than the fan's power budget ("No" at the decision block $808$), the method $800$ include the HM controller $116$ connecting the TE elements $200_1$-$200_n$ to the output port $304$ using the configuration selected in the decision block $808$ (in a block $810$). Operations of the block $810$ further include the HM controller $116$ supplementing the electrical power provided by the TE elements $200_1$-$200_n$ at the output port $304$ with an additional electrical power that is sufficient to cover the power deficit. In various examples, the HM controller $116$ may channel the additional electrical power from a battery, a main power supply of the data storage device $102$, or an external (such as ac mains) power supply. The HM controller $116$ then operates to connect the electrical fan $530$ to the combined power source including the TE elements $200_1$-$200_n$ and the supplemental power source and turns ON the electrical fan $530$ to run at the selected speed.

When the estimated TE power output is sufficient for the fan's power budget ("Yes" at the decision block $808$), the method $800$ includes the HM controller $116$ connecting the TE elements $200_1$-$200n$ to the output port $304$ using the configuration selected in the decision block $808$ (in a block $812$). Operations of the block $812$ further include the HM controller $116$ connecting the electrical fan $530$ to the output port $304$ and turning ON the electrical fan $530$ to run at the selected speed.

The method $800$ also includes the HM controller $116$ determining whether a temperature metric $T_M$ is below a second threshold value $T_2$ (in a decision block $814$). In some examples, the second threshold value $T_2$ is lower than the first threshold value $T_1$ used in the block $804$. In some other examples, the second threshold value $T_2$ is the same as the first threshold value $T_1$. When the temperature metric $T_M$ is higher than the threshold value $T_2$ ("No" at the decision block $814$), the method $800$ includes a next batch of temperature values communicated by the temperature sensors is processed by the HM controller $116$ in the next instance of the decision block $814$ while the electrical fan $530$ continues to run (in the decision block $814$). When the temperature metric $T_M$ is lower than the threshold value $T_2$ ("Yes" at the decision block $814$), the HM controller $116$ operates to turn OFF the electrical fan $530$. Then, the method $800$ is terminated.

FIG. $9$ is a block diagram illustrating certain functions of the data-storage system $10$ according to one example. In the example shown, the system $10$ includes the device assembly $500$ described above in reference to FIGS. $5$ and $6$. Temperature sensors associated with the TE elements $200_1$-$200_4$ of the device assembly $500$ provide temperature measurements $T_1$-$T_4$ to a computation module $910$, which resides in the HM controller $116$ (e.g., see FIGS. $1$, $3A$, $3B$, and $7$). In response to the received temperature measurements, the computation module $910$ operates to compute the temperature metric $T_M$, e.g., as part of the operations of the block $804$ of the method $800$ (also see FIG. $8$). When the temperature metric $T_M$ is greater than the threshold value $T_1$ ("Yes" at the decision block $804$), the HM controller $116$ closes a switch SW to connect the electrical fan $530$ to the voltage $V_{out}$ generated by a power source $920$. The power source $920$ is powered using a combination $916$ of the voltages $V_1$-$V_4$ generated by the TE elements $200_1$-$200_4$ optionally supplemented by an external power supply $918$, e.g., as explained above in the description of the blocks $808$-$812$ of the method $800$. In some examples, the power connection is routed through a resistor mesh $930$, e.g., as described above in reference to FIGS. 3A-3B.

FIG. $10$ is a block diagram $1000$ illustrating various processes in the data-storage system $10$ according to one example. Blocks $12$, $14$, and $16$ of the block diagram $1000$ indicate various heat flows and temperature measurements in the data-storage system $10$ that affect one or more inputs

Figure 9:
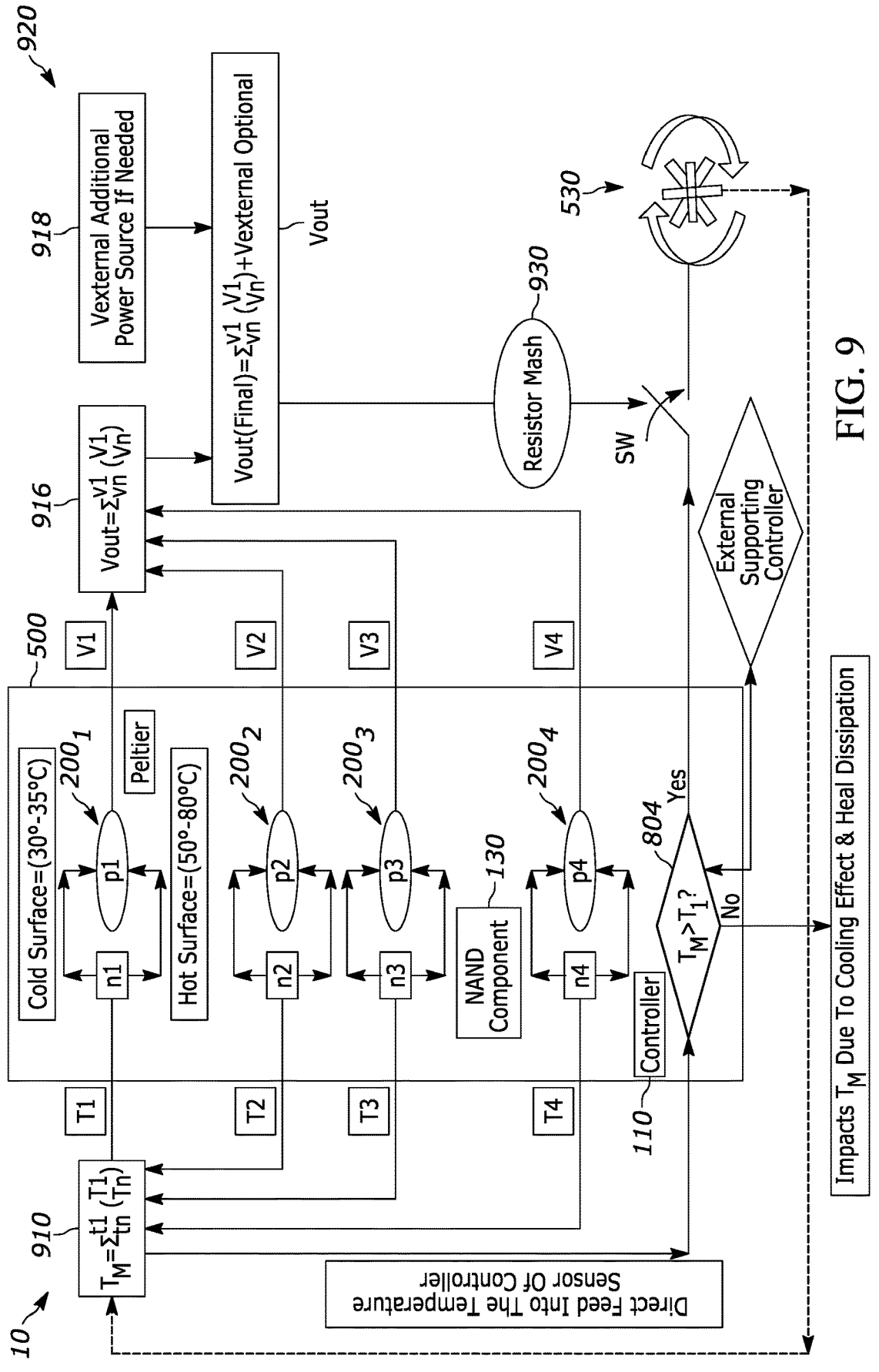
FIG. 9 is a block diagram illustrating certain functions of the data-storage system of FIG. 1 according to one example.
Figure 10:
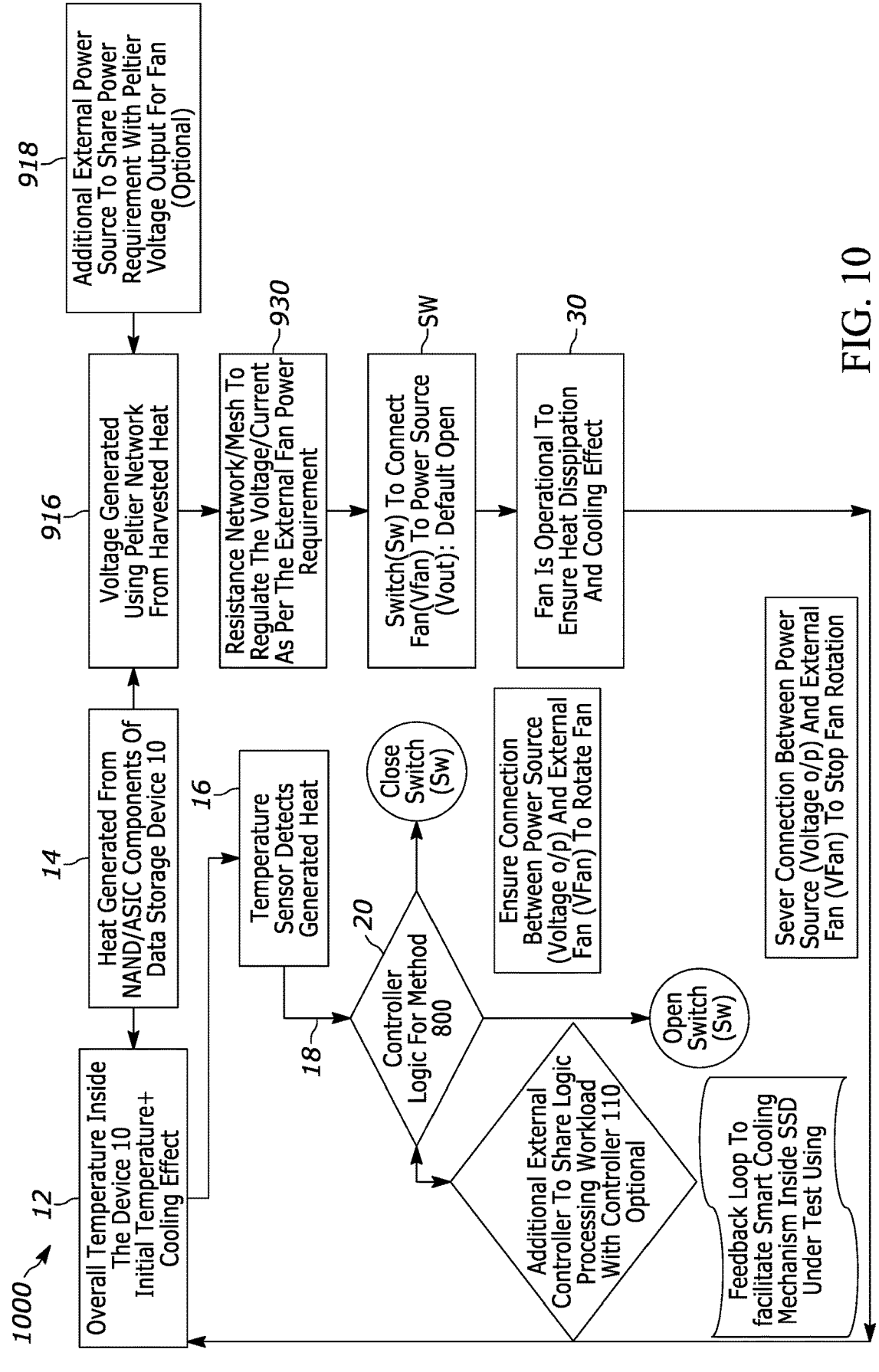
FIG. 10 is a block diagram illustrating various processes in the data-storage system of FIG. 1 according to one example.

18 to a controller logic 20 of the HM controller 116. In the example shown, the controller logic 20 operates the switch SW (also see FIG. 9) in accordance with the method 800. When the switch SW is closed, the power provided by the combination 916 of the voltages $V_1$-$V_4$ generated by the TE elements 200$_1$-200$_4$, which is optionally supplemented by the external power supply 918, is applied, via the resistor mesh 930 to the electrical fan 530 (also see FIG. 9). A cooling effect 30 of the working fan 530 feeds back into the various heat flows and temperature measurements indicated by the blocks 12, 14, and 16.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain implementations and should in no way be construed to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

Unless explicitly stated otherwise, each numerical value and range should be interpreted as being approximate as if the word "about" or "approximately" preceded the value or range.

The use of figure numbers and/or figure reference labels (if any) in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the disclosure. The appearances of the phrase "in one embodiment" in various places in the specification are not necessarily all referring to the same embodiment, nor are separate or alternative embodiments necessarily mutually exclusive of other embodiments. The same applies to the term "implementation."

Unless otherwise specified herein, the use of the ordinal adjectives "first," "second," "third," etc., to refer to an object of a plurality of like objects merely indicates that different instances of such like objects are being referred to, and is not intended to imply that the like objects so referred-to have to be in a corresponding order or sequence, either temporally, spatially, in ranking, or in any other manner.

Unless otherwise specified herein, in addition to its plain meaning, the conjunction "if" may also or alternatively be construed to mean "when" or "upon" or "in response to determining" or "in response to detecting," which construal may depend on the corresponding specific context. For example, the phrase "if it is determined" or "if [a stated condition] is detected" may be construed to mean "upon determining" or "in response to determining" or "upon detecting [the stated condition or event]" or "in response to detecting [the stated condition or event]."

Throughout the detailed description, the drawings, which are not to scale, are illustrative only and are used in order to explain, rather than limit the disclosure. The use of terms such as height, length, width, top, bottom, is strictly to facilitate the description of the embodiments and is not intended to limit the embodiments to a specific orientation. For example, height does not imply only a vertical rise limitation, but is used to identify one of the three dimensions of a three-dimensional structure as shown in the figures. Such "height" would be vertical where the plates are horizontal but would be horizontal where the plates are vertical, and so on. Similarly, while all figures show the different plates and boards as horizontal layers such orientation is for descriptive purpose only and not to be construed as a limitation.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. The same type of distinction applies to the use of terms "attached" and "directly attached," as applied to a description of a physical structure. For example, a relatively thin layer of adhesive or other suitable binder can be used to implement such "direct attachment" of the two corresponding components in such physical structure.

The described embodiments are to be considered in all respects as only illustrative and not restrictive. In particular, the scope of the disclosure is indicated by the appended claims rather than by the description and figures herein. All changes that come within the meaning and range of equivalency of the claims are to be embraced within their scope.

The functions of the various elements shown in the figures, including any functional blocks labeled as "processors" and/or "controllers," may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

As used in this application, the term "circuitry" may refer to one or more or all of the following: (a) hardware-only circuit implementations (such as implementations in only analog and/or digital circuitry); (b) combinations of hardware circuits and software, such as (as applicable): (i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions); and (c) hardware circuit(s) and or processor(s), such as a microprocessor(s) or a portion of a microprocessor(s), that requires software (e.g., firmware) for operation, but the software may not be present when it is not needed for operation." This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and if applicable to the particular claim element, a baseband integrated circuit or processor integrated circuit for a mobile device or a similar integrated circuit in server, a cellular network device, or other computing or network device.

"SUMMARY" in this specification is intended to introduce some example embodiments, with additional embodiments being described in "DETAILED DESCRIPTION" and/or in reference to one or more drawings. "SUMMARY" is not intended to identify essential elements or features of the claimed subject matter, nor is it intended to limit the scope of the claimed subject matter.

"ABSTRACT" is provided to allow the reader to quickly ascertain the nature of the technical disclosure. It is submitted with the understanding that it will not be used to interpret or limit the scope or meaning of the claims. In addition, in the foregoing "DETAILED DESCRIPTION." it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into "DETAILED DESCRIPTION," with each claim standing on its own as a separately claimed subject matter.

What is claimed is:
1. A device, comprising:
    a first plate having a first main surface and an opposite second main surface;

a second plate disposed at a nonzero offset distance from the first plate along the first main surface;
    an electrical fan having a set of blades arranged within a gap between the first plate and the second plate, the electrical fan being operable to rotate the set of blades about a rotation axis that is approximately orthogonal to the first main surface;
    a plurality of thermoelectric (TE) elements disposed along the opposite second main surface in thermal contact with the first plate; and
    a heat-management (HM) controller connected to receive a plurality of voltages generated by the plurality of TE elements in response to respective temperature differences across individual ones of the plurality of TE elements, the HM controller being configured to use the plurality of voltages to provide electrical power to the electrical fan.

2. The device of claim 1, wherein the HM controller is implemented using an integrated-circuit (IC) chip attached to the first plate.

3. The device of claim 2, further comprising:
    a first set of electrical lines connecting the HM controller and the plurality of TE elements; and
    a second set of electrical lines connecting the HM controller and the electrical fan.

4. The device of claim 3, further comprising a third set of electrical lines connecting the HM controller to an electrical connector disposed along the opposite second main surface for providing wireline connections between the HM controller and a second controller.

5. The device of claim 1, further comprising a plurality of spacer columns attached between the first plate and the second plate and arranged for an external air flow to enter the gap between the first plate and the second plate along any direction substantially parallel to the first main surface.

6. The device of claim 5, wherein the plurality of spacer columns comprises copper.

7. The device of claim 1, wherein the HM controller is configured to manage the electrical power by selectively switching electrical connections of the plurality of TE elements.

8. The device of claim 1, further comprising a printed-circuit-board (PCB) assembly including a printed circuit board and a plurality of integrated-circuit (IC) chips attached and electrically connected to the printed circuit board,
    wherein the individual ones of the TE elements are attached to corresponding ones of the IC chips; and
    wherein the respective temperature differences across the individual ones of the TE elements are caused by heat generated in the corresponding ones of the IC chips.

9. The device of claim 8, wherein the plurality of IC chips includes a plurality of storage dies of a data storage device.

10. The device of claim 9,
    wherein the plurality of IC chips includes an IC chip implementing an electronic controller of the data storage device; and
    wherein the electronic controller includes the HM controller.

11. The device of claim 8, wherein the plurality of IC chips includes an IC chip implementing the HM controller.

12. The device of claim 11, wherein the PCB assembly and the first plate have matching electrical connectors to connect the HM controller and the electrical fan.

13. The device of claim 11, further comprising:
    a first set of electrical lines connecting the HM controller and the plurality of TE elements; and a second set of electrical lines connecting the HM controller and a corresponding one of the matching electrical connectors.

14. The device of claim 1, wherein a TE element of the plurality of TE elements comprises a plurality of Peltier modules connected to be thermally in parallel and electrically in series with one another.

15. A heat-management method, comprising:

sensing one or more temperatures in one or more locations within a device assembly; and electrically connecting a plurality of thermoelectric (TE) elements to provide electrical power to an electrical fan when a temperature metric is greater than a first threshold value, the temperature metric being based on the one or more temperatures, wherein the device assembly comprises:

a printed-circuit-board (PCB) assembly including a printed circuit board and a plurality of integrated-circuit (IC) chips attached and electrically connected to the printed circuit board;

the plurality of TE elements having individual ones of the TE elements thermally connected between corresponding ones of the IC chips and an adjacent part of a device case of the device assembly; and a heat-management (HM) controller connected to receive a plurality of voltages generated by the plurality of TE elements in response to heat generated in the corresponding ones of the IC chips, the HM controller being configured to use the plurality of voltages to provide the electrical power to the electrical fan; and wherein the electrical fan is configured to generate an airflow that removes heat from the device case.

16. The heat-management method of claim 15, further comprising electrically disconnecting the plurality of TE elements from the electrical fan when the temperature metric is smaller than a second threshold value.

17. The heat-management method of claim 15, further comprising supplementing the electrical power with an additional electrical power to meet a power budget of the electrical fan.

18. The heat-management method of claim 15, further comprising selecting a speed for the electrical fan based on a difference between the temperature metric and the first threshold value.

19. The heat-management method of claim 15, wherein the plurality of IC chips includes a plurality of storage dies of a data storage device and an electronic controller of the data storage device; and wherein the electronic controller includes the HM controller.

20. A data storage device, comprising:

a device case including a bottom casing and a lid assembly attached to each other, the lid assembly including an electrical fan;

a printed-circuit-board assembly disposed in the device case and including a printed circuit board and a plurality of integrated-circuit (IC) chips attached and electrically connected to the printed circuit board, the plurality of IC chips including a plurality of storage dies and an electronic controller; and a plurality of thermoelectric (TE) elements having individual ones of the TE elements thermally connected between corresponding ones of the IC chips and the lid assembly, wherein the electronic controller is configured to receive a plurality of voltages generated by the plurality of TE elements in response to heat generated in the corresponding ones of the IC chips and further configured to use the plurality of voltages to provide electrical power to the electrical fan; and wherein the electrical fan is configured to generate an airflow that removes heat from the device case.

* * * * *